(12) United States Patent
Lo et al.

(10) Patent No.: US 8,836,127 B2
(45) Date of Patent: Sep. 16, 2014

(54) INTERCONNECT WITH FLEXIBLE DIELECTRIC LAYER

(75) Inventors: Ching-Yu Lo, Hsinchu (TW); Bo-Jiun Lin, Jhubei (TW); Hai-Ching Chen, Hsinchu (TW); Tien-I Bao, Hsin-Chu (TW); Shau-Lin Shue, Hsinchu (TW); Chen-Hua Yu, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 12/621,569

(22) Filed: Nov. 19, 2009

(65) Prior Publication Data
US 2011/0115088 A1    May 19, 2011

(51) Int. Cl.
 *H01L 23/522* (2006.01)
 *H01L 23/532* (2006.01)
 *H01L 23/00* (2006.01)

(52) U.S. Cl.
CPC . *H01L 23/53295* (2013.01); *H01L 2924/01013* (2013.01); *H01L 23/5329* (2013.01); *H01L 2924/01029* (2013.01); *H01L 2924/01023* (2013.01); *H01L 2924/14* (2013.01); *H01L 24/02* (2013.01); *H01L 2924/01015* (2013.01); *H01L 2924/05042* (2013.01); *H01L 2924/01082* (2013.01); *H01L 2924/01019* (2013.01); *H01L 2924/01033* (2013.01); *H01L 2924/01079* (2013.01); *H01L 2924/01014* (2013.01); *H01L 2924/0105* (2013.01); *H01L 2924/014* (2013.01); *H01L 2924/01006* (2013.01); *H01L 2924/01007* (2013.01); *H01L 2924/0102* (2013.01)

USPC .................. 257/758; 257/637; 257/643

(58) Field of Classification Search
USPC .................................. 257/643, 758
See application file for complete search history.

(56) References Cited

U.S. PATENT DOCUMENTS

| | | | |
|---|---|---|---|
| 6,486,557 B1 | 11/2002 | Davis et al. | |
| 6,833,604 B2 * | 12/2004 | Tsau | 257/532 |
| 7,135,398 B2 * | 11/2006 | Fitzsimmons et al. | 438/618 |
| 7,485,949 B2 * | 2/2009 | Ko et al. | 257/646 |
| 2002/0137323 A1 * | 9/2002 | Loboda | 438/600 |
| 2003/0228750 A1 * | 12/2003 | Lee et al. | 438/623 |
| 2004/0094839 A1 | 5/2004 | Fitzsimmons et al. | |
| 2007/0149758 A1 * | 6/2007 | Wang et al. | 528/310 |
| 2008/0064225 A1 * | 3/2008 | Yau et al. | 438/780 |
| 2010/0063485 A1 * | 3/2010 | Johnson et al. | 604/890.1 |
| 2010/0207293 A1 * | 8/2010 | Nakayama et al. | 264/214 |

FOREIGN PATENT DOCUMENTS

CN    1711635 A    12/2005

OTHER PUBLICATIONS

Office Action Nov. 23, 2011 in counterpart Chinese application.

\* cited by examiner

*Primary Examiner* — Howard Weiss
*Assistant Examiner* — Tifney Skyles
(74) *Attorney, Agent, or Firm* — Duane Morris LLP; Steven E. Koffs

(57) ABSTRACT

An integrated circuit device has a dual damascene structure including a lower via portion and an upper line portion. The lower via portion is formed in a polyimide layer, and the upper line portion is formed in an inter-metal dielectric (IMD) layer formed of USG or polyimide. A passivation layer is formed on the IMD layer, and a bond pad is formed overlying the passivation layer to electrically connect the upper line portion.

20 Claims, 5 Drawing Sheets

INTERCONNECT WITH FLEXIBLE DIELECTRIC LAYER

TECHNICAL FIELD

The present disclosure relates generally to semiconductor integrated circuits (ICs), and more specifically for interconnect structures and methods of forming the interconnect structures.

BACKGROUND

Semiconductor ICs include active devices formed on a semiconductor substrate, with an interconnect structure formed over the active devices. The interconnect structure typically includes from three to 15 printed circuit layers. Each printed circuit layer is formed of an intermetal dielectric (IMD) material having one or more trenches, which are filled with a conductive material, such as copper or aluminum, to form conductive lines. Each IMD layer also includes a plurality of conductive vias, which connect lines in adjacent layers.

The materials and layout of the IMD layers are selected to minimize size, propagation delays, and crosstalk between nearby lines. One technique for achieving these goals is the use of IMD materials with low dielectric constants. As designs are developed for advanced technology nodes (e.g., with a critical dimension of 65 nm, 45 nm or smaller), the use of materials having a dielectric constant (k) less than that of silicon dioxide is being considered, including low-k materials having a k value of less than 3.5 and extreme low-k (ELK) having a k value of less than 3.0. For example, two low-k materials that are being explored extensively for advanced technology ICs are "BLACK DIAMOND™" carbon doped silicon dioxide (k~3.0), sold by Applied Materials, Inc., of Santa Clara, Calif., and "SiLK™" aromatic hydrocarbon thermosetting polymer (k~2.7), sold by Dow Chemical Company of Midland, Mich. For lower dielectric constants, foundries have also considered use of porous dielectric materials, since the value of k for air is 1.0. Using porous dielectric materials, an average k value for the IMD layers can be reduced to about 2.0.

Unfortunately, ELK materials have mechanical properties that are less advantageous than those of $SiO_2$. ELK materials tend to be brittle relative to $SiO_2$. For example, although $SiO_2$ has an elastic modulus of 78 Gpa, for "SiLK™" the modulus is only 2.7 Gpa. Also, although the coefficient of thermal expansion (CTE) of $SiO_2$ is compatible with the IC substrate and the package substrate to which the IC will be mounted, many low-k and ELK materials have CTE values that differ substantially from that of the package substrate. As a result, during tests, de-lamination and cracking of the top IMD layers have been observed.

DETAILED DESCRIPTION

Figure 1:
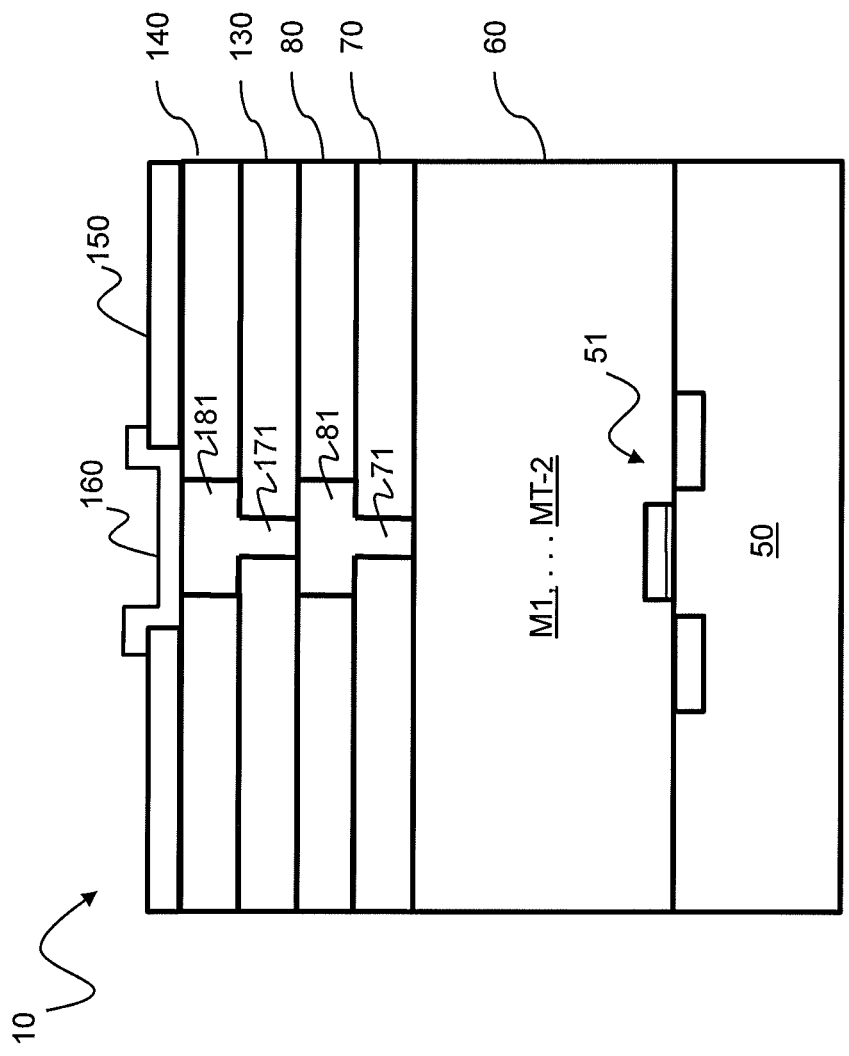
FIG. 1 is a cross-sectional view of an exemplary IC.

This description of the exemplary embodiments is intended to be read in connection with the accompanying drawings, which are to be considered part of the entire written description. In the description, relative terms such as "lower," "upper," "horizontal," "vertical,", "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning conductive coupling and the like, such as "connected" and "interconnected," refer to a relationship wherein structures conduct charge carriers either directly or indirectly through intervening conductive structures.

Embodiments are described below, in which a flexible film is used as a high level IMD material in one or more layers, instead of using the same IMD material included in the lower IMD levels throughout the entire interconnect structure. For example, the flexible film may be positioned above a weak or mechanically fragile IMD material layer, and under the pad. In some embodiments, the flexible material is polyimide. In some embodiments, a single flexible film layer is included. In other embodiments, the flexible film material may be substituted for the IMD material in more than one via level IMD layer and/or one or more metal level IMD layers to increase the stress release effect.

For example, consider an interconnect structure having IMD levels M1-M8, using an extreme low-k (ELK) dielectric material.

(1) In some embodiments, the flexible film is substituted for the ELK material in the Top Via level $V_T$.

(2) In some embodiments, the flexible film is substituted for the ELK material in the Top-1 Via level $V_{T-1}$.

(3) In some embodiments, the flexible film is substituted for the ELK material in both the Top Via and Top-1 Via levels, $V_T$ and $V_{T-1}$.

(4) In some embodiments, the flexible film is substituted for the ELK material in the Top Via and Top metal, $V_T$ and $M_T$ (whole IMD layer).

(5) In some embodiments, the flexible film is substituted for the passivation material above the $M_T$ level.

(6) In some embodiments, the flexible film is substituted for the ELK material in the Top Via level $V_T$, but with a middle stop layer included.

The flexible film provided in the Top Via level $V_T$ and/or Top-1 Via level $V_{T-1}$ provides stress release to reduce or avoid cracking. In some embodiments the top metal $M_T$ level and top metal-1 $M_{T-1}$ level are formed of the same IMD material used in the lower IMD layers, allowing simple and effective planarization of the $M_T$ level, using chemical mechanical polishing, for example.

FIG. 1 is a cross-sectional diagram of an IC 10 having a flexible film substituted in the Top Via level $V_T$ IMD layer 130 (a "first IMD layer"), according to the first example mentioned above. The IC 10 includes a semiconductor substrate 50. The substrate 50 may be, for example, a silicon substrate, a III-V compound substrate, a glass substrate with a semiconductor layer thereon, a liquid crystal display (LCD) substrate or the like. The substrate 50 has at least one active device at its surface such as transistor 51. A first plurality of IMD layers 60 are formed over the substrate 50, including $V_1$, $M_1$, $V_2$, $M_2, \ldots V_{T-2}, M_{T-2}$, where $V_{T-2}$ is two levels below the top via level, and $M_{T-2}$ is two levels below the top metal ($M_T$) level. Details of the first plurality of IMD layers 60 are omitted for clarity and brevity, but are understood by one of ordinary skill in the art. The first plurality of IMD layers 60 may be formed of any suitable dielectric material, including ELK dielectric materials having a dielectric constant k less than 3.0, low-k dielectric materials having k less than 3.5, or medium k materials. For example, the IMD material in the first plurality of IMD layers 60 may be porous or non-porous carbon doped silicon dioxide, such as "BLACK DIAMOND™" or "BLACK DIAMOND II™" carbon doped silicon dioxide, sold by Applied Materials, Inc., of Santa Clara, Calif., or "AURORA™" "AURORA 2.7™" or "AURORA ULK™" carbon doped silicon dioxide from ASM International N.V., of Almere, Netherlands.

The $V_{T-1}$ and $M_{T-1}$ via and line layers are formed in the IMD layers 70 and 80, respectively. The $V_T$ and $M_T$ (top via and top metal) layers are formed in the IMD layers 130 and 140, respectively. Conductive lines 81, 181 and conductive vias 71, 171 may be formed of copper in the top two IMD levels 130, 140, respectively, using a dual damascene process, for example.

The top via ($V_T$) IMD layer 130 (first IMD layer), is formed of a material selected to provide a stress buffer layer. Optionally, in some embodiments, the $V_{T-1}$ IMD layer 70 (also a first IMD layer) is also formed of the same material as top via ($V_T$) IMD layer 130, to provide an additional stress buffer layer. In some embodiments, the $M_T$ and $M_{T-1}$ IMD layers are formed of a different dielectric material than the $V_T$ and $V_{T-1}$ IMD layers, respectively. In other embodiments, the $M_T$ IMD layer 140 (second IMD layer) and/or $M_{T-1}$ IMD layer 80 (also a second IMD layer) may also be formed of the same material as $V_T$ IMD layer 130, to provide an additional stress buffer layer. Thus, the $V_T$ IMD layer 130, plus any one or more of the $V_{T-1}$ IMD layer 70, $M_T$ IMD layer 140 and $M_{T-1}$ IMD layer 80 layers may be formed of the material for providing a stress buffer layer. A passivation layer 150 is formed above the $M_T$ IMD layer 140. A bond pad 160 is above the passivation layer 150.

In some embodiments, the stress buffer layer material in IMD layer 130 is a high glass transition temperature (Tg) type polyimide. The polyimide properties may include: CTE <25 ppm/° C.; Elastic Modulus >3 Gpa; Elongation rate 10~45%; tensile strength >150 Mpa; and dielectric constant <3.5 The thermal expansion is the cause of the high thermal stress, due to differential elongation between the $M_T$ IMD layer 140 and the package substrate (not shown). So adding a buffer IMD layer 130 having a CTE closer to that of the substrate 50 than the lower IMD level dielectric material helps improve the yield.

In some embodiments, the $V_T$ IMD layer 130 is formed of a flexible thermosetting polymer, such as polyimide. In some embodiments, the $V_T$ IMD layer 130 is formed of polyimide, and the $M_T$ IMD layer 140 is formed of one of the group consisting of undoped silica glass (USG), phosphor doped silicate glass (PSG), fluorine doped silicate glass (FSG), SiN, SiCN, and SiON. In some embodiments, both the $V_T$ IMD layer 130 and $V_{T-1}$ IMD layer 70 are formed of polyimide, and the $M_T$ IMD layer 140 and $M_{T-1}$ IMD layer 80 are formed of one of the group consisting of undoped silica glass (USG), phosphor doped silicate glass (PSG), fluorine doped silicate glass (FSG), SiN, SiCN, and SiON. In some embodiments, the $V_T$ IMD layer 130, $V_{T-1}$ IMD layer 70, $M_T$ IMD layer 140 and $M_{T-1}$ IMD layer 80 are all formed of polyimide.

In some embodiments, the $V_T$ IMD layer 130 is formed of a low-k material, such as "BLACK DIAMOND™" carbon doped silicon dioxide. In some embodiments, the $V_T$ IMD layer 130 is formed of carbon doped silicon dioxide, and the $M_T$ IMD layer 140 is formed of undoped silica glass (USG). In some embodiments, the $V_T$ IMD layer 130 and $V_{T-1}$ IMD layer 70 are formed of carbon doped silicon dioxide, and the $M_T$ IMD layer 140 and $M_{T-1}$ IMD layer 80 are formed of undoped silica glass (USG).

In an IC wherein the first plurality of IMD layers 60 comprise an ELK dielectric material having a dielectric constant of about 2.5 or less, the stress buffer IMD layer 130 provides a flexible structure for stress release above the IMD layers 60 and below the pad on which a solder bump or ball (not shown) is formed. This stress buffer IMD layer 130 protects the active devices 51 Even in an IC where the first plurality of IMD layers 60 comprise a low-k dielectric material having a dielectric constant of about 2.5 to about 3.0, use of the flexible material in the stress buffer IMD layer 130 and IMD layer 140 can provide improved yield.

Figure 3:
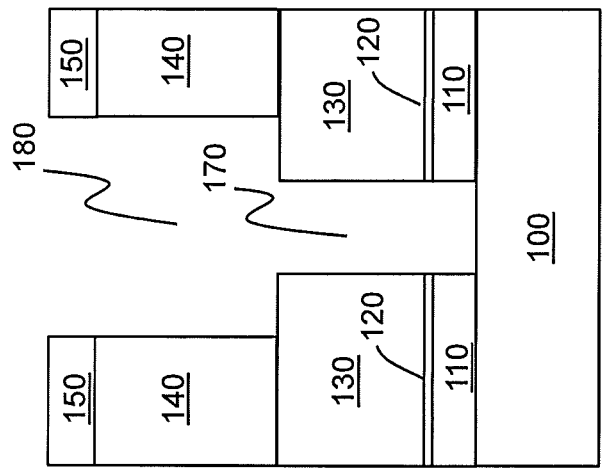
FIG. 3 shows the IC of FIG. 2 after top via formation and top metal layer trench formation.
Figure 2:
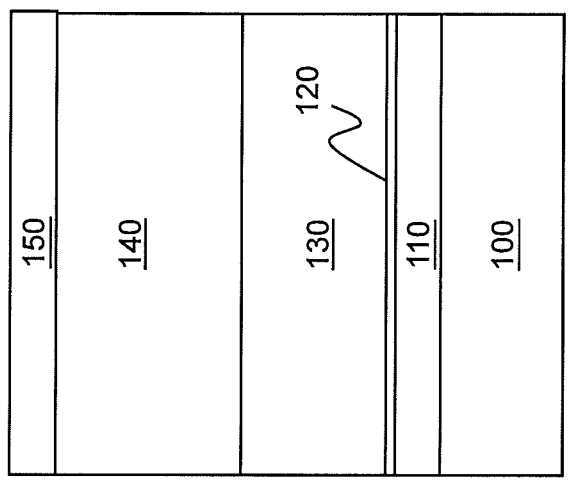
FIG. 2 is a more detailed cross-sectional diagram showing details of the structure from which the IC of FIG. 1 is formed.
Figure 4:
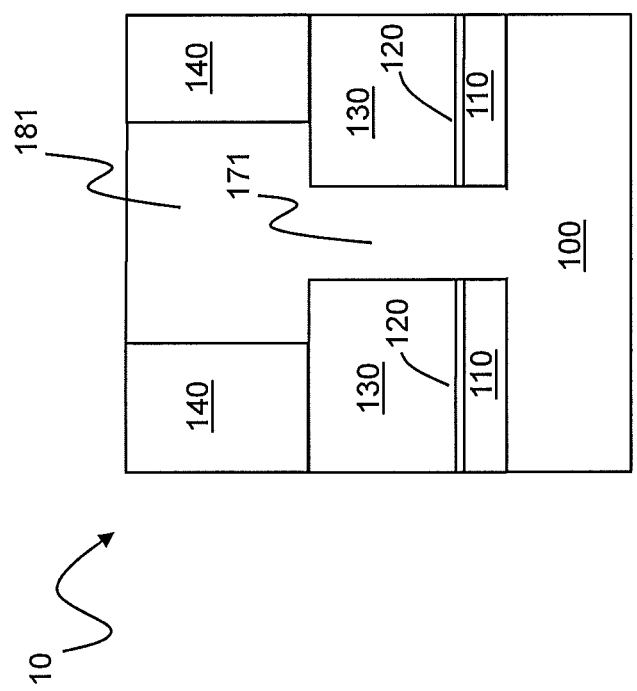
FIG. 4 shows the IC of FIG. 3 after filling the via and trench, and planarization.

FIGS. 2-4 show three stages in the process of forming the interconnect structure of IC 10. In FIGS. 2-4, the layer 100 represents the $M_{T-1}$ IMD layer 80 formed over the substrate 50, the first plurality of IMD layers 60 and $V_{T-1}$ IMD layer 70. Substrate 50, layers 60 and 70 are not shown individually in FIGS. 2-4 for brevity. Referring first to FIG. 2, after forming a first plurality of inter-metal dielectric (IMD) layers 60 over the semiconductor substrate 50 having at least one active device 51, an etch stop layer 110 is formed over the $M_{T-2}$ layer. The etch stop layer 110 may be a 550 angstrom layer of high temperature nitrogen doped SiC, for example. An adhesion promoter 120 may be applied over the etch stop layer 110. For example, a 20 angstrom layer of silane adhesion promoter is suitable for forming a good bond between stop layer 110 and a polyimide IMD layer 130. One of ordinary skill in the art can readily select an appropriate adhesion promoter that is suitable for any selected combination of materials used to form stop layer 110 and $V_T$ IMD layer 130.

A stress buffer via IMD layer 130 is formed on the adhesion promoter. In some embodiments, the $V_T$ IMD layer 130 is a layer from about 1500 angstroms to about 6000 angstroms thick, and may be formed of a thermosetting polymer, such as polyimide, or an organic polymeric thermoset, silsesquioxane, or a benzocyclobutene-based polymer.

Alternatively, the $V_T$ IMD layer 130 may be formed of a low-k dielectric material (such as "BLACK DIAMOND™" carbon doped silicon dioxide, abbreviated below as BD). BD has a mechanical strength that is higher than ELK. Comparing the three materials, the mechanical strength of USG is greater than that of BD, which is greater than that of ELK. Thus, if ELK is used as an IMD material with a USG Top layer, the stress is likely to be relatively large. If a BD layer is substituted in the $V_T$ IMD layer 130, the stress gap is reduced to improve the results. Thus, a variety of flexible buffer layer materials (which are more flexible than the IMD material used in the first plurality of IMD layers 60) may be used in $V_T$ IMD layer 130 and/or $V_{T-1}$ IMD layer 70, A layer 140 of line level dielectric material 140, is formed on the top via level IMD layer 130. In some embodiments, the $M_T$ IMD layer 140 may be from about 4000 angstroms thick to about 10,000 angstroms thick, and may be formed of USG, for example.

A passivation layer 150 is formed over the $M_T$ IMD layer 140. The passivation layer 150 may be a layer of silicon oxynitride (SiON), of about 500 angstrom to 600 angstrom thickness, for example. In some embodiments, a second passivation layer is formed over the first passivation layer.

In one embodiment, the respective thicknesses of the via IMD, line IMD and passivation layers 130, 140 and 150 are 1500 angstroms, 4000 angstroms and 500 angstroms respectively. In another embodiment, the respective thicknesses of the via IMD, line IMD and passivation layers 130, 140 and 150 are 4000 angstroms, 10,000 angstroms and 600 angstroms respectively.

FIG. 3 shows the structure of FIG. 2, after etching a trench 180 and a via opening 170 through the line IMD layer 140 and via IMD layer 130, respectively, by a dual damascene process.

FIG. 4 shows the structure of FIG. 3 after a bulk fill step to fill the via 170 and trench 180 with conductive material, such as copper. As shown in FIG. 4, a via 171 passes though IMD layer 130 from a top thereof to a bottom thereof, with a conductive material therein. At least one line IMD layer 140 is provided on the at least one via IMD layer 130. The at least one line IMD layer 140 includes a trench 180 parallel to a surface of the line IMD Layer 140, the trench filled with a conductive material forming a line 181. The conductive line 181 is conductively connected to the conductive via 171.

Figure 5:
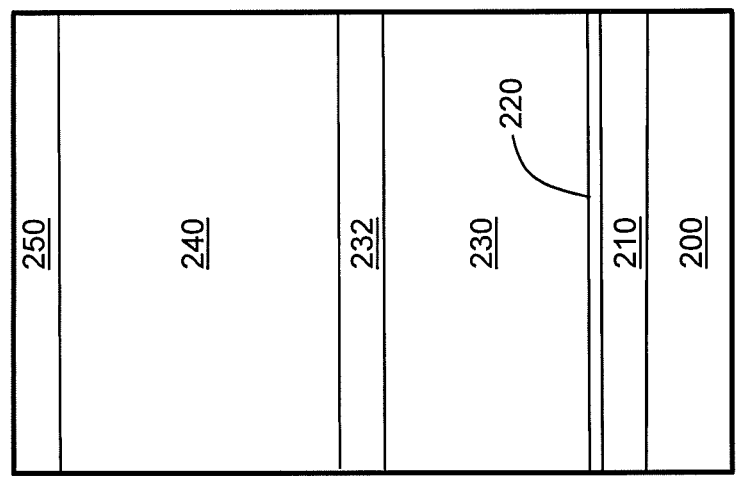
FIG. 5 shows a variation of the structure of FIG. 2, with an additional etch stop layer.

FIG. 5 shows a variation of the structure shown in FIG. 2, in which an additional stop layer 232 is provided between the $V_T$ layer 230 and the $M_T$ layer 240. The additional stop layer 232 may be formed of SiON or SiN, for example. An additional stop layer 232 may provide better etching control. In one embodiment, the respective thicknesses of $V_T$ layer 230, stop layer 232, the $M_T$ layer 240, and passivation layer 250 are 6000 angstroms, 600 angstroms, 10,000 angstroms and 600 angstroms, respectively. $V_T$ layer 230 may be formed of polyimide, carbon doped silicon dioxide, or one of the other dielectrics discussed above with reference to FIGS. 2-4. The remaining layers, including substrate 200, etch stop 210, adhesion promoter 220, and passivation layer 250 are similar to the corresponding substrate 100, etch stop 110, adhesion promoter 120, and passivation layer 150 described above with reference to FIGS. 2-4, and descriptions of these layers is not repeated.

The structures shown in FIGS. 2-5 emphasize configurations in which the top via IMD layer is formed of a different material than the IMD dielectric material in the first plurality of IMD layers 60. In some embodiments, only one via IMD layer (e.g., the top via MID layer $V_T$) is formed of the stress buffer material, and the $V_{T-1}$ via level DAD layer and $M_{T-1}$ line level IMD layer are formed of extreme low k (ELK) dielectric material. However, in other embodiments, the top two or more via level IMD layers $V_T$, $V_{T-1}$ are formed of the stress buffer material.

Figure 6:
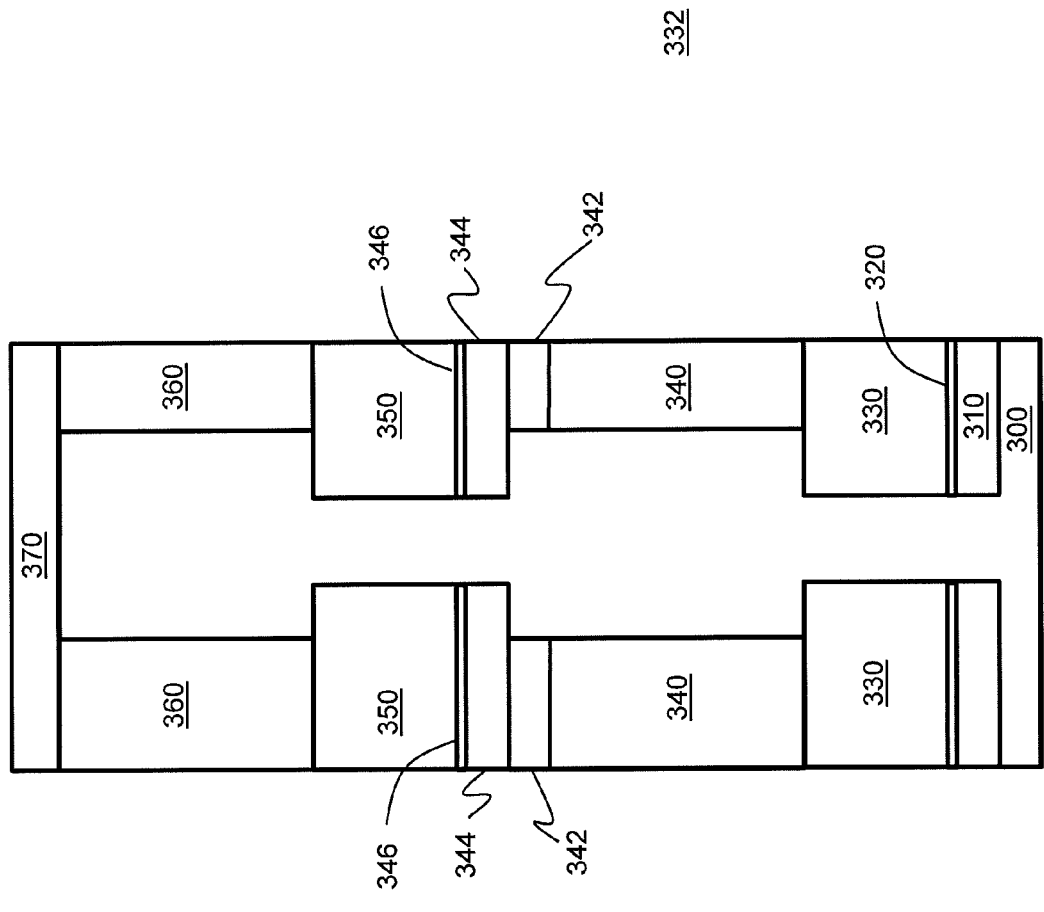
FIG. 6 shows a variation of the structure of FIG. 1 having two hybrid dielectric layers.

FIG. 6 is a cross-sectional view of another embodiment, in which the top two via $V_T$ and $V_{T-1}$ IMD layers 350 and 330 are formed of the stress buffer material. In FIG. 6, layer 300 represents the combination of the underlying semiconductor substrate and the first plurality of IMD layers 60, up to the $M_{T-2}$ line layer. In some embodiments, the first plurality of IMD layers (from $V_1$ to $V_{T-2}$ and $M_1$ to $M_{T-2}$) comprise a low-k material having k or an ELK dielectric material having k≤3.0. The structure includes etch stop layer 310, adhesion promoter 320, $V_{T-1}$ via IMD layer 330, $M_{T-1}$ line IMD layer 340, passivation layer 342, etch stop layer 344, adhesion promoter 346, $V_T$ via IMD layer 350, $M_T$ line IMD layer 360, and passivation layer 370.

Both $V_T$ IMD layer 350 and $V_{T-1}$ IMD layer 330 are formed of a polymer or low-k material. In some embodiments, both $V_T$ IMD layer 350 and $V_{T-1}$ IMD layer 330 are formed of polyimide, and the first plurality of IMD layers 60 (from $V_1$ to $V_{T-2}$ and $M_1$ to $M_{T-2}$) comprise a dielectric material having k which may be low-k or ELK. In other embodiments, both $V_T$ IMD layer 350 and $V_{T-1}$ IMD layer 330 are formed of carbon doped silicon oxide, and the first plurality of IMD layers (from $V_1$ to $V_{T-2}$ and $M_1$ to $M_{T-2}$) comprise an ELK dielectric material having k≤3.0.

In some embodiments, both $M_{T-1}$ IMD layer 340 and $M_T$ IMD layer 360 are formed of USG. In other embodiments, $M_{T-1}$ IMD layer 340 is formed of and USG, and $M_T$ IMD layer 360 is formed of the stress buffer material (e.g., polyimide). In other embodiments, both $M_{T-1}$ IMD layer 340 and $M_T$ IMD layer 360 are formed of the stress buffer material.

In one embodiment, the etch stop layers 310 and 344 are 550 angstrom thick high-temperature nitrogen doped SiC, adhesion promoter layers 320 and 346 are 20 angstrom thick layers of silane, $V_T$ IMD layer 350 and $V_{T-1}$ IMD layer 330 are 4000 angstrom thick layers of stress buffer material, and the $M_{T-1}$ line IMD layer 340 and $M_T$ line IMD layer 360 are 10,000 angstrom thick layers of USG.

Simulations by the inventors suggest that including the stress buffer material in both the $V_T$ IMD layer 350 and $V_{T-1}$ IMD layer 330 layers can provide comparable stress reduction to that provided by a single layer of stress buffer material having a larger thickness in the $V_T$ IMD layer 350. For example, if a single polyimide via layer $V_T$ 4000 angstroms thick covered by a USG top metal layer 10,000 angstroms thick provides acceptable results, then a configuration as shown in FIG. 6, where $V_T$ IMD layer 350 and $V_{T-1}$ IMD layer 330 are polyimide 1500 angstroms thick, and the $M_{T-1}$ line layer 340 and $M_T$ line IMD layer 360 are USG 4,000 angstroms thick should also provide acceptable results.

Although examples are described above in which the $V_T$ and $V_{T-1}$ via IMD layers are formed of a stress buffer material (such as polyimide or carbon doped silicon dioxide), in other embodiments, additional via IMD layers (e.g., $V_{T-2}$, $V_{T-3}$ or the like) may be formed of the stress buffer material. Correspondingly, additional line IMD layers (e.g., $M_{T-2}$, $M_{T-3}$ or the like) on the via IMD layers ($V_{T-2}$, $V_{T-3}$ or the like) may be formed of USG or of the same material as the stress buffer layer.

Among the examples described above, those embodiments in which the $V_T$ IMD layer 130, 230, 350 comprises polymer, such as polyimide, and the $M_T$ IMD layer 140, 240, 360 comprises USG may provide a manufacturability advantage over embodiments in which the $M_T$ IMD layer comprises a polymer, because chemical mechanical polishing (CMP) techniques used to planarize the top metal $M_T$ layer are better adapted to planarizing glass than a polyimide layer.

Although the invention has been described in terms of exemplary embodiments, it is not limited thereto. Rather, the appended claims should be construed broadly, to include other variants and embodiments of the invention, which may be made by those skilled in the art without departing from the scope and range of equivalents of the invention.

What is claimed is:

1. A device, comprising
   a plurality of low k inter-metal dielectric (IMD) layers formed over a semiconductor substrate, the low k IMD layers having a dielectric constant less than 3.0, the substrate comprising at least one active device;
   at least one first IMD layer over the plurality of low k IMD layers, the at least one first IMD layer comprising a first via formed of a conductive material, the first IMD layer formed of a polyimide material having a coefficient of thermal expansion less than 25 ppm/° C. and an elastic Modulus greater than 3 Gpa,
   at least one second IMD layer above the at least one first IMD layer, the at least one second IMD layer comprising a first trench filled with a conductive material forming a first conductive line, the first conductive line conductively connected to the first via, wherein the second IMD layer is made of a material that is more susceptible to planarization than the first IMD layer.

2. The device of claim 1, wherein the second IMD layer is one of the group consisting of undoped silicate glass, phosphor doped silicate glass (PSG), fluorine doped silicate glass (FSG), SiN, SiCN, and SiON.

3. The device of claim 1, wherein:
the first via in the first IMD layer is a top-level via of an integrated circuit (IC), and
the first conductive line in the second IMD layer is a top-level conductive line of the IC.

4. The device of claim 3, further comprising:
a third IMD layer formed between the plurality of low k IMD layers and the first IMD layer and comprising a second trench filled with a conductive material forming a second conductive line, the second conductive line conductively connected to the first via,
wherein the third IMD layer is formed of one of the group consisting of USG, PSG, FSG, SiN, SiCN and SiON.

5. The device of claim 4, further comprising:
a fourth IMD layer formed between the plurality of low k IMD layers and the third IMD layer and comprising a second via formed of a conductive material, the second via conductively connected to the second conductive line;
where the fourth IMD layer is formed of polyimide.

6. The device of claim 3, further comprising:
a third IMD layer formed between the plurality of low k IMD layers and the first IMD layer and comprising a second trench filled with a conductive material forming a second conductive line, the second conductive line conductively connected to the first via;
wherein the third IMD layer is formed of extreme low k (ELK) dielectric material.

7. The device of claim 3, further comprising:
a fourth IMD layer formed between the plurality of low k IMD layers and the third IMD layer and comprising a second via formed of a conductive material, the second via conductively connected to the second conductive line;
where the fourth IMD layer is formed of extreme low k (ELK) dielectric material.

8. The device of claim 1, further comprising:
an etch stop layer between the plurality of low k IMD layers and the first IMD layer; and
an adhesion promoter between the etch stop layer and the first IMD layer.

9. The device of claim 1, wherein the second IMD layer is formed of polyimide.

10. The device of claim 1, further comprising
a passivation layer over the second IMD layer; and
a bond pad overlying the passivation layer and conductively connected to the first conductive line.

11. An integrated circuit device, comprising:
a semiconductor substrate;
a plurality of low k inter-metal dielectric (IMD) layers over the substrate, the low k IMD layers having a dielectric constant less than 3.0;
a polyimide layer having a coefficient of thermal expansion less than 25 ppm/° C. and an elastic Modulus greater than 3 Gpa, formed over the plurality of low k IMD layers;
a first inter-metal dielectric (IMD) layer formed on the polyimide layer, wherein the first IMD layer is made of a material that is more susceptible to planarization than the polyimide layer;

a conductive structure formed overlying the semiconductor substrate and comprising a lower via portion and an upper line portion, wherein the lower via portion is formed in the polyimide layer, and the upper line portion is formed in the first IMD layer;
a passivation layer formed on the first IMD layer and exposing the upper line portion of the conductive structure; and
a bond pad formed overlying the passivation layer and on the upper line portion of the conductive structure.

12. The integrated circuit device of claim 11, wherein the first IMD layer is formed of undoped silicate glass (USG).

13. The integrated circuit device of claim 11, wherein the first IMD layer is formed of polyimide.

14. The integrated circuit of claim 12, further comprising:
a second polyimide layer having a coefficient of thermal expansion less than 25 ppm/° C. formed above the plurality of low k inter-metal dielectric (IMD) layers and below the first polyimide layer;
a second IMD layer formed above the second polyimide layer and below the first polyimide layer, the second IMD layer formed of USG; and
a second conductive structure formed overlying the semiconductor substrate and comprising a second lower via portion and a second upper line portion, wherein the second lower via portion is formed in the second polyimide layer, and the second upper line portion is formed in the second IMD layer.

15. The integrated circuit of claim 14, further comprising:
a first SiC etch stop layer below the first polyimide layer;
a first silane adhesion promoter layer on the first SiC etch stop layer;
a second passivation layer on the second IMD layer;
a second SiC etch stop layer between the plurality of low k IMD layers and the second polyimide layer;
a second silane adhesion promoter layer on the second SiC etch stop layer.

16. An integrated circuit device, comprising:
a semiconductor substrate;
a plurality of low k inter-metal dielectric (IMD) layers over the substrate, the low k IMD layers having a dielectric constant less than 3.0;
a first SiC etch stop layer over the plurality of low k IMD layers;
a first silane adhesion promoter layer on the first SiC etch stop layer;
a first polyimide layer having a coefficient of thermal expansion less than 25 ppm/° C. and an elastic Modulus greater than 3 Gpa, formed over the first silane adhesion promoter layer;
a first undoped silicate glass (USG) layer formed on the first polyimide layer;
a passivation layer formed over the first IMD layer and exposing the upper line portion of the conductive structure;
a second SiC etch stop layer over the passivation layer;
a second silane adhesion promoter layer on the second SiC etch stop layer;
a second polyimide layer having a coefficient of thermal expansion less than 25 ppm/° C. and an elastic Modulus greater than 3 Gpa, formed over the second silane adhesion promoter layer;
a second USG layer formed on the second polyimide layer;
a conductive structure comprising first and second conductive vias formed in the first and second polyimide layers, respectively, and first and second conductive lines formed in the first and second USG layers, respectively; and a bond pad formed overlying the passivation layer and on the second conductive line.

17. The integrated circuit of claim 16, wherein the first and second polyimide layers have a tensile strength greater than 150 Mpa.

18. The device of claim 1, wherein the first polyimide layer has a tensile strength greater than 150 Mpa.

19. The device of claim 1, wherein the first IMD layer is made of a material that is more flexible than the low k IMD layers.

20. The device of claim 17, wherein the first and second USG layers are made of a material that is more susceptible to planarization than the first and second polyimide layers, and the first and second polyimide layers are made of a material that is more flexible than the plurality of low k IMD layers.

* * * * *